United States Patent
Nasu

(10) Patent No.: US 10,433,433 B2
(45) Date of Patent: Oct. 1, 2019

(54) WIRING SUBSTRATE FOR ELECTRONIC COMPONENT INSPECTION APPARATUS

(71) Applicant: NGK SPARK PLUG CO., LTD., Nagoya, Aichi (JP)

(72) Inventor: Takakuni Nasu, Komaki (JP)

(73) Assignee: NGK SPARK PLUG CO., LTD., Nagoya (JP)

( * ) Notice: Subject to any disclaimer, the term of this patent is extended or adjusted under 35 U.S.C. 154(b) by 0 days.

(21) Appl. No.: 16/143,752

(22) Filed: Sep. 27, 2018

(65) Prior Publication Data
US 2019/0098770 A1    Mar. 28, 2019

(30) Foreign Application Priority Data

Sep. 28, 2017 (JP) .................. 2017-187842

(51) Int. Cl.
| | |
|---|---|
| *H05K 3/40* | (2006.01) |
| *H05K 7/20* | (2006.01) |
| *H01L 21/67* | (2006.01) |
| *H01L 21/683* | (2006.01) |
| *H05K 3/46* | (2006.01) |
| *H05K 1/03* | (2006.01) |
| *H05K 1/11* | (2006.01) |
| *G01R 1/073* | (2006.01) |

(52) U.S. Cl.
CPC ....... *H05K 3/4626* (2013.01); *G01R 1/07307* (2013.01); *H05K 1/0306* (2013.01); *H05K 1/111* (2013.01)

(58) Field of Classification Search
CPC . H05K 3/40; H05K 7/20; H01L 21/67; H01L 21/683
USPC ................ 174/255, 529; 438/25; 361/704
See application file for complete search history.

(56) References Cited

U.S. PATENT DOCUMENTS

| | | | | |
|---|---|---|---|---|
| 3,886,840 A | * | 6/1975 | Bossler | F16B 31/02 116/DIG. 34 |
| 4,023,225 A | * | 5/1977 | Tochilkin | B21J 3/00 470/11 |
| 4,215,235 A | * | 7/1980 | Kaufman | H01R 12/57 174/16.3 |
| 4,347,655 A | * | 9/1982 | Zory | H01L 31/0203 257/116 |
| 4,993,621 A | * | 2/1991 | Koy | F16B 5/00 228/140 |

(Continued)

FOREIGN PATENT DOCUMENTS

JP        2011-165945 A        8/2011

*Primary Examiner* — Xiaoliang Chen
(74) *Attorney, Agent, or Firm* — Stites & Harbison, PLLC; Jeffrey A. Haeberlin

(57) ABSTRACT

A wiring substrate for electronic component inspection apparatus includes a first laminate which is formed by stacking a plurality of ceramic layers and which has a front surface and a back surface, and a plurality of studs joined to the back surface of the first laminate, wherein each of the studs is composed of a flange portion which is circular in bottom view, and a bolt portion which perpendicularly extends from a center portion of an outside surface of the flange portion; and in a vertical cross section along an axial direction of the bolt portion, the outside surface from which the bolt portion protrudes has a curved surface which is convex toward an inside surface of the flange portion facing the back surface of the first laminate.

6 Claims, 2 Drawing Sheets

(56) References Cited

U.S. PATENT DOCUMENTS

| | | | | |
|---|---|---|---|---|
| 5,475,956 | A * | 12/1995 | Agrawal | B29C 35/08 |
| | | | | 296/201 |
| 5,621,615 | A * | 4/1997 | Dawson | H01L 23/4006 |
| | | | | 165/80.4 |
| 6,289,741 | B1 * | 9/2001 | Ghetzler | G01N 3/08 |
| | | | | 73/150 A |
| 2006/0240686 | A1 * | 10/2006 | Jiten | H01R 13/2421 |
| | | | | 439/66 |
| 2007/0102142 | A1 * | 5/2007 | Reis | H01L 23/3677 |
| | | | | 165/80.3 |
| 2007/0102419 | A1 * | 5/2007 | Kushihashi | H01L 21/67103 |
| | | | | 219/546 |
| 2007/0131674 | A1 * | 6/2007 | Kushihashi | H01C 17/00 |
| | | | | 219/543 |
| 2009/0060126 | A1 * | 3/2009 | Kotooka | A61B 6/032 |
| | | | | 378/22 |
| 2010/0251661 | A1 * | 10/2010 | Illgner | F16B 33/004 |
| | | | | 52/698 |
| 2011/0146412 | A1 * | 6/2011 | Hoering | G01L 5/246 |
| | | | | 73/776 |
| 2011/0156740 | A1 * | 6/2011 | Hwang | G01R 1/07378 |
| | | | | 324/756.03 |
| 2011/0170980 | A1 * | 7/2011 | McGrade | F41H 1/04 |
| | | | | 411/338 |
| 2012/0164600 | A1 * | 6/2012 | Courvoisier | A61C 8/005 |
| | | | | 433/173 |
| 2015/0183061 | A1 * | 7/2015 | Rossberg | H05K 3/3431 |
| | | | | 403/272 |
| 2017/0278732 | A1 * | 9/2017 | Amano | H01L 21/67103 |
| 2018/0033668 | A1 * | 2/2018 | Tsuchida | H01L 21/67103 |

\* cited by examiner

WIRING SUBSTRATE FOR ELECTRONIC COMPONENT INSPECTION APPARATUS

TECHNICAL FIELD

The present invention relates to a wiring substrate for use in an electronic component inspection apparatus for inspecting electrical characteristics of a large number of electronic components, for example, semiconductor devices, formed along the surface of a silicon wafer.

BACKGROUND ART

In order to adjust the posture of the wiring substrate in relation to the inspection apparatus for bringing a plurality of probe pins into uniform and individual contact with the large number of electronic components, the wiring substrate has studs each of which has a bolt and a flat flange having a circular shape in plan view. The flanges of the studs are joined to the back surface of the wiring substrate opposite its front surface having pads for probe for disposing the probe pins, in such a manner that the bolts become perpendicular to the back surface. For example, regarding the case where via conductors (conductors for connection between adjacent layers) are located on the back surface to which the studs are joined, at positions around the studs, in order for the substrate to be less susceptible to occurrence of cracking in the vicinity of the via conductors even in the event of application of a large external force to the studs, there have been proposed a multilayer ceramic substrate for which various dimensions such as the distance between the center axis of the via conductor and the circumcircle of a brazing material layer used to join the stud to a surface metal layer formed on the back surface are specified as appropriate, as well as a method of manufacturing the multilayer ceramic substrate (see, for example, Patent Document 1).

However, the multilayer ceramic substrate and the method of manufacturing the same have the following problem. In the case where a large external force which pulls a stud outward along the axial direction of its bolt is applied to the stud, a shearing force along the thickness direction of the substrate acts between the peripheral edge of the flat flange of the stud and the back surface of the multilayer ceramic substrate. As a result, a crack along the thickness direction of the substrate may be generated in the ceramic near a region of the back surface of the substrate, which region is located adjacent to the peripheral edge of the flange of the stud. In the case where such a crack is generated, it becomes difficult to accurately inspect a plurality of electronic components to be inspected, and the multilayer ceramic substrate itself breaks.

PRIOR ART DOCUMENT

Patent Document

[Patent Document 1] Japanese Patent Application Laid-Open (kokai) No. 2011-165945 (pages 1 to 20, FIGS. 1 to 7)

SUMMARY OF THE INVENTION

Problem to be Solved by the Invention

An object of the present invention is to solve the problems described above in the section Background Art and to provide a wiring substrate for electronic component inspection apparatus which includes a first laminate formed of ceramic and a plurality of studs joined to the back surface of the first laminate and in which, even when an axial external force is applied to a bolt portion or nut tube portion of a stud, a crack is less likely to be generated in the ceramic in a region of the back surface of the first laminate, which region is located adjacent to the circumferential edge of a flange portion of the stud.

Means for Solving the Problem and Effect of the Invention

In order to solve the above problem, the present invention has been conceived according to the following idea: the outside surface of the flange portion of the stud is formed by a curved surface which is convex toward the back surface of the first laminate in a vertical cross section along the axial direction of the bolt portion, etc. perpendicularly provided at a center portion of the outside surface.

Specifically, the wiring substrate for electronic component inspection apparatus of the present invention (claim 1) is a wiring substrate for electronic component inspection apparatus comprising a first laminate which is formed by stacking a plurality of ceramic layers and which has a front surface and a back surface, and a plurality of studs joined to the back surface of the first laminate, the wiring substrate for electronic component inspection apparatus being characterized in that each of the studs is composed of a flange portion which is circular in bottom view, and a bolt portion or a nut tube portion which perpendicularly extends from a center portion of the flange portion; and, in a vertical cross section of the flange portion along an axial direction of the bolt portion or the nut tube portion, an outside surface of the flange portion from which the bolt portion or the nut tube portion protrudes is defined by a curve which is convex toward an inside surface of the flange portion facing the back surface of the first laminate.

The wiring substrate for electronic component inspection apparatus yields the following effect (1).

(1) The outside surface of the flange portion of the stud is defined by a curve which is convex toward the inside surface facing the back surface of the first laminate, in a vertical cross section along the axial direction of the bolt portion or the nut tube portion which is perpendicularly provided at the center portion of the outside surface. Namely, the above-mentioned outside surface makes the thickness of the flange portion at the peripheral edge in plan view smaller than that at the center portion in plan view. Therefore, when an external force in a direction away from the back surface of the first laminate acts on the stud along the axial direction of the bolt portion or the nut tube portion, the stress (component force) of the external force acting on a peripheral part of the above-mentioned flange portion, which part has a relatively small thickness, is mitigated. Accordingly, it is possible to reliably prevent or restrain generation of a crack in the ceramic layer near a region of the back surface of the first laminate, which region is located adjacent to the peripheral edge of the above-mentioned flange portion.

Notably, the ceramic layers constituting the first laminate are formed of a low-temperature-firing ceramic, such as glass-ceramic, or a high-temperature-firing ceramic, such as alumina.

Also, inner wiring layers and via conductors are formed as appropriate in the first laminate in a mutually electrically communicating manner. The inner wiring layers and via conductors are formed of copper or a copper alloy; silver or a silver alloy; or tungsten, molybdenum, or the like.

Further, the stud is formed of, for example, Kovar (Fe-29% Ni-17% Co), 42 alloy (Fe-42% Ni), 194 alloy (Cu-2.3% Fe-0.03% P), or stainless steel.

Also, the curve which defines the outside surface of the flange portion of the stud constitutes at least a region of the outside surface of the flange portion in the radial direction, excluding the bolt portion or the nut tube portion located at the center portion of the outside surface in plan view, the region extending from the center portion and being 50% or more of the outside surface.

In addition, in the case where the diameter of the flange portion of the stud is, for example, 10 to 14 mm, the thickness of the center portion of the flange portion is 3 to 7 mm. The thread (thread nominal diameter) of the bolt portion or nut tube portion of the stud is, for example, M4 or M5.

Also, the present invention encompasses a wiring substrate for electronic component inspection apparatus in which, in the vertical cross section along the axial direction of the bolt portion or the nut tube portion, the outside surface of the flange portion of the stud is defined by a curve having a single curvature radius or a curve having a plurality of curvature radiuses (claim 2).

Of these embodiments, the embodiment in which the outside surface is defined by a curve having a single curvature radius facilitates the design and manufacture of the stud including the flange portion. Meanwhile, in the embodiment in which the outside surface is defined by a curve having a plurality of curvature radiuses, the thickness of the flange portion can be increased toward the center portion and decreased further as approaching the periphery by constituting a center-side portion of the outside surface of the flange portion by a curve having a small curvature radius and a peripheral-edge-side portion of the outside surface by a curve having a large curvature radius. Accordingly, the above-described effect (1) can be attained more remarkably.

Notably, examples of the curve having a plurality of curvature radiuses include parabola, cycloid curve, and trochoid curve.

Further, the present invention encompasses a wiring substrate for electronic component inspection apparatus in which a thickness of the flange portion at its center is greater than that at its periphery (claim 3).

In this case, since the thickness of the flange portion of the stud at its center is greater than that at its periphery, the above-described effect (1) can be attained more reliably. Further, a decrease in the strength of the flange portion can be prevented (hereinafter referred to as the "effect (2)").

Also, the present invention encompasses a wiring substrate for electronic component inspection apparatus in which each of the studs has an annular surface which has a length of 200 μm or less along the axial direction of the bolt portion or the nut tube portion and which is located between a peripheral edge of the outside surface of the flange portion of the stud and a peripheral edge of the inside surface of the flange portion of the stud (claim 4).

In this case, in addition to the above-described effect (1), the following effect (3) can be attained.

(3) The cross section of the peripheral portion of the brazing material layer that is disposed between the inside surface of the flange portion and a metal layer (which will be described later) has a fillet shape formed as a result of expanding, due to wetting, along the axial direction of the above-mentioned annular surface. As a result, it is possible to prevent the peripheral portion of the brazing material layer from accidentally extending, due to wetting, into a region of the back surface of the first laminate, which region is located outside the metal layer. As a result, it is possible to prevent accidental formation of short circuits between the studs and, for example, external connection terminals formed on the back surface of the first laminate at a fine pitch such that the external connection terminals are located adjacent to the respective studs.

Notably, the lower limit of the length of the annular surface along the axial direction is 100 μm.

Further, the present invention encompasses a wiring substrate for electronic component inspection apparatus in which each of the studs is joined to the back surface of the first laminate via a brazing material layer which is disposed between the inside surface of the flange portion of the stud and a metal layer formed on the back surface of the first laminate (claim 5).

In this case, since the inside surface of the flange portion of the stud can be easily brazed to the metal layer which is previously formed on the back surface of the first laminate formed of ceramic, the above-described effect (1) can be attained more reliably.

Notably, the metal layer is formed by, for example, sequentially laminating a thin film layer of titanium formed by sputtering, a thin film layer of copper formed by sputtering, a layer of nickel formed by electroplating, and a layer of copper formed by electroplating, and covering the entire outside surfaces of these layers with a film of gold formed by electroplating.

Also, the brazing material which becomes the brazing material layer is, for example, gold brazing material or silver brazing material. Examples of the gold brazing material include Au—Sn alloy and Au—Cu alloy. Examples of the silver brazing material include Ag—Cu alloy and Ag—Cu—Zn alloy.

Further, the above-described brazing material is supplied, for example, in a molten state to the surface of the metal layer or the inside surface of the flange portion of the stud through use of a dispenser. Alternatively, the above-described brazing material is preformed into a shape similar to the outer shape of the flange portion in plan view and is disposed on the surface of the metal layer or the inside surface of the flange portion.

Additionally, the present invention encompasses a wiring substrate for electronic component inspection apparatus in which a second laminate formed by stacking a plurality of resin layers is disposed on the front surface of the first laminate, and a plurality of pads for probe is formed on a front surface of the second laminate (claim 6).

In this case, in addition to the above-described effects (1) to (3), the following effect (4) can be attained.

(4) By adjusting, through the plurality of studs, the posture of the present wiring substrate with respect to a surface of a silicon wafer or the like to be inspected, the probe pins which are individually disposed later on the upper surfaces of the plurality of pads for probe can be easily disposed at a fine pitch (very narrow spacing). Thus, it becomes possible to individually bring the probe pins into contact with a plurality of electronic components formed on the surface of the silicon wafer or the like, and accurately perform a desired electrical inspection.

Notably, the probe pins are individually disposed on the pads for probe later on.

Also, the resin layers of the second laminate are formed of, for example, polyimide, which is excellent in heat resistance, and inner wiring layers and via conductors are also formed as appropriate in the second laminate in a mutually electrically communicating manner. The inner wiring layers and via conductors are formed of copper or a copper alloy, or silver or a silver alloy.

Further, polyimide which is unlikely to thermally deform at the temperature of the above-described brazing is recommended for the resin material constituting the resin layers.

MODES FOR CARRYING OUT THE INVENTION

Embodiments of the present invention will next be described.

Figure 1:
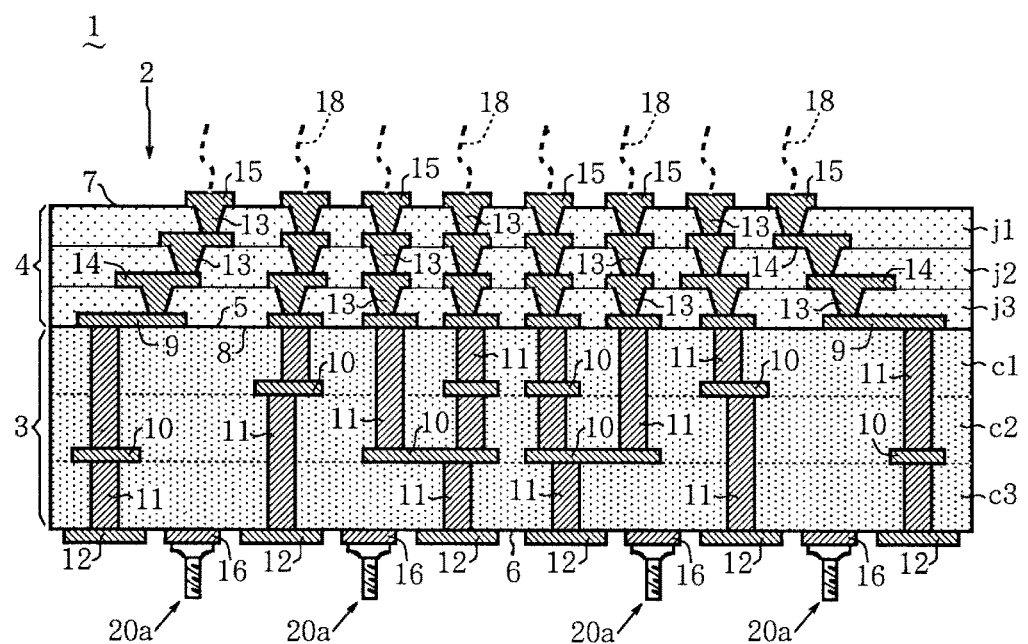
FIG. 1 Vertical cross sectional view showing a wiring substrate for electronic component inspection apparatus according to an embodiment of the present invention.

FIG. 1 is a vertical cross sectional view showing a wiring substrate for electronic component inspection apparatus (hereinafter, referred to merely as the wiring substrate) 1 according to an embodiment of the present invention.

As shown in FIG. 1, the wiring substrate 1 includes a substrate main body 2 which is composed of a first laminate 3 formed of ceramic and a second laminate 4 stacked on a front surface 5 of the first laminate 3 and formed of resin; and a plurality of studs 20a joined to a back surface 6 of the first laminate 3.

As shown in FIG. 1, the first laminate 3 includes three (a plurality of) ceramic layers c1 to c3 stacked together and has the front surface 5 and the back surface 6 which face each other. A plurality of surface wiring layers 9 are formed on the front surface 5, and a plurality of inner wiring layers 10 are formed between the ceramic layers c1 to c3. A plurality of metal layers 16 are formed on the back surface 6, and the plurality of studs 20a are individually brazed to the surfaces of the metal layers 16. A plurality of external connection terminals (hereinafter, referred to merely as the connection terminals) 12 are formed on the back surface 6 such that the connection terminals 12 are located adjacent to the respective studs 20a and are spaced from one another.

The surface wiring layers 9, the inner wiring layers 10, and the connection terminals 12 are electrically connected through via conductors 11 penetrating the ceramic layers c1 to c3 at arbitrary positions.

Notably, the ceramic layers c1 to c3 are formed of, for example, glass-ceramic, and the surface wiring layers 9, the inner wiring layers 10, the via conductors 11, and the connection terminals 12 are formed of, for example, copper or a copper alloy.

Also, as shown in FIG. 1, the second laminate 4 includes three (a plurality of) resin layers j1 to j3 stacked together and has a front surface 7 and a back surface 8 which face each other. A plurality of pads for probe 15 are formed on the front surface 7, and a plurality of inner wiring layers 14 are formed between the resin layers j1 to j3. As shown in the drawing, probe pins 18 are individually disposed on the upper surfaces of the pads for probe 15 later on.

Through via conductors (filled vias) 13 which individually penetrate the resin layers j1 to j3, the pads for probe 15 are electrically connected to the inner wiring layers 14, and the inner wiring layers 14 at one inter-layer boundary are electrically connected to the inner wiring layers 14 at the other inter-layer boundary.

Notably, the resin layers j1 to j3 are formed of, for example, polyimide which is excellent in heat resistance, and the via conductors 13, the inner wiring layers 14, and the pads for probe 15 are formed of, for example, copper or a copper alloy.

Also, the front surface 5 of the first laminate 3 and the back surface 8 of the second laminate 4 are joined to each other via an unillustrated adhesive layer such that the via conductors 13 penetrating the resin layer j3 are electrically connected to the surface wiring layers 9 of the first laminate 3.

Further, as shown in FIG. 1, the plurality of metal layers 16 are formed on the back surface 6 of the first laminate 3 such that the metal layers 16 are located adjacent to the corresponding connection terminals 12. Each metal layer 16 is formed on the back surface 6 of the ceramic layer c3 as follows. A thin film layer of titanium formed by sputtering, a thin film layer of copper formed by sputtering, a layer of copper formed by electroplating, and a layer of nickel formed by electroplating, and covering the entire outside surfaces of these layers with a film of gold formed by electroplating (these layers are unillustrated).

Figure 2:
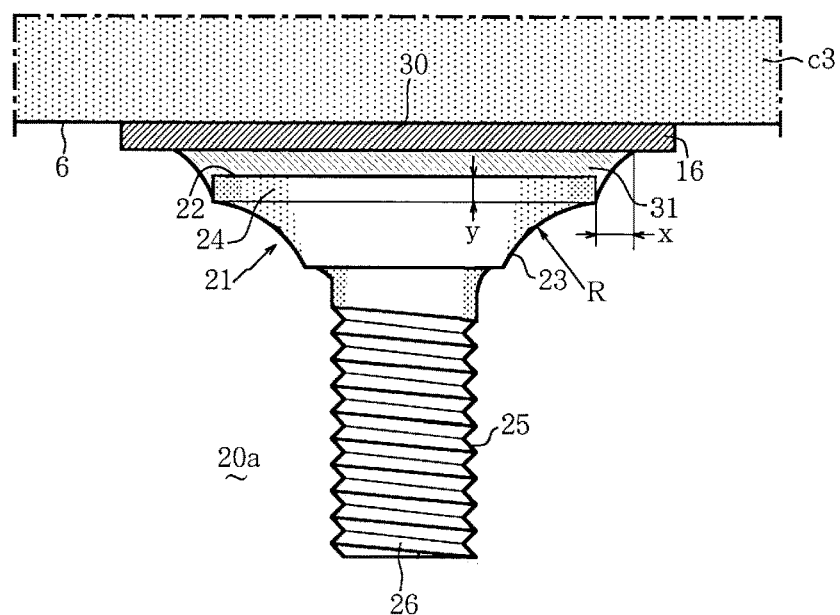
FIG. 2 Enlarged fragmentary view showing one stud and its vicinity in the wiring substrate.

As shown in the enlarged view of FIG. 2, each stud 20a is joined to the surface of the corresponding metal layer 16 via a brazing material layer 30. The stud 20a is a single member formed of, for example, Kovar and includes a flange portion 21 having a trapezoidal vertical cross section and a bolt portion 26 which perpendicularly extends from a central portion of an outside surface 23 of the flange portion 21 (a surface opposite a surface facing the back surface 6 of the first laminate 3) in plan view. The flange portion 21 has an inside surface 22 (a surface facing the back surface 6 of the first laminate 3) which has a circular shape in plan view, an outside surface 23 which extends from the proximal end of the bolt portion 26 toward the peripheral edge of the flange portion 21 and curves such that the outside surface 23 gradually approaches the inside surface 22, and a ring-shaped annular surface 24 which is located between the peripheral edge of the outside surface 23 and the peripheral edge of the inside surface 22. As viewed in a vertical cross section along the axial direction of the bolt portion 26, the outside surface 23 is defined by a curve which is convex toward the inside surface 22, and the curve has a single curvature radius R. Due to such an outside surface 23, the thickness of a central portion of the flange portion 21, which is located on the proximal end side of the bolt portion 26, is greater than the thickness of a peripheral portion of the flange portion 21.

Notably, a length y of the annular surface 24 in the axial direction is equal to or less than 200 μm and is equal to or greater than 100 μm.

Also, an external thread 25 is spirally formed, through cutting, on the outer circumferential surface of the bolt portion 26.

Further, the curve which defines the outside surface 23 of the flange portion 21 may define the outside surface 23 only in a region in the radial direction, excluding the bolt portion 26, the region being located on the proximal end side of the bolt portion 26.

In the case where the diameter of the flange portion 21 is, for example, 10 to 14 mm, the thickness of the center portion of the flange portion 21 is 3 to 7 mm, and the external thread 25 of the bolt portion 26 is, for example, M4.

As shown in FIG. 2, the disk-shaped brazing material layer 30 is disposed between the metal layer 16 and the flange portion 21 of the stud 20a, and the stud 20a is joined to the back surface 6 of the first laminate 3 via the brazing material layer 30 and the metal layer 16.

The brazing material layer 30 is formed of, for example, Au-Su alloy (whose melting point is about 300° C.) and has a peripheral portion 31 which protrudes from the peripheral edge of the flange portion 21 of the stud 20a such that its length x along the outward direction (radial direction) is 200 μm or less. The peripheral portion 31 has a fillet which has an approximately L-shaped vertical cross section and extends along the surface of the metal layer 16 and the annular surface 24.

Figure 3:
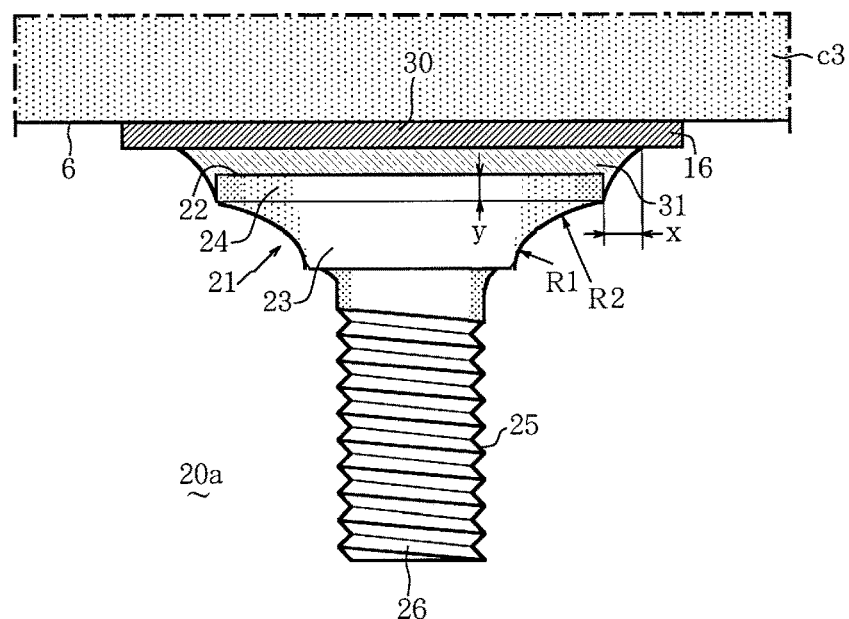
FIG. 3 Enlarged fragmentary view which is similar to the above-described view and which shows a different form of the stud.

FIG. 3 is an enlarged fragmentary view which is similar to FIG. 2 and which shows an embodiment different from the above-described embodiment. As shown in FIG. 3, the stud 20a has a flange portion 21 and a bolt portion 26 which are similar to those of the above-described stud. As viewed in a vertical cross section along the axial direction of the bolt portion 26, the outside surface 23 of the flange 21 is defined by successive two (a plurality of) curves of different curvature radiuses R1 and R2; i.e., a curve on the center side having a relatively small curvature radius R1 and a curve on the peripheral side having a relatively large curvature radius R2. Of these curves, the curve on the peripheral side has a relatively small (gentle) inclination angle in relation to the inside surface 22 of the flange portion 21 as compared with the curve on the center side. In other words, the above-described flange portion 21 is such that its thickness on the peripheral side in plan view is considerably smaller (thinner) than the thickness on the center side in plan view.

Figure 4:
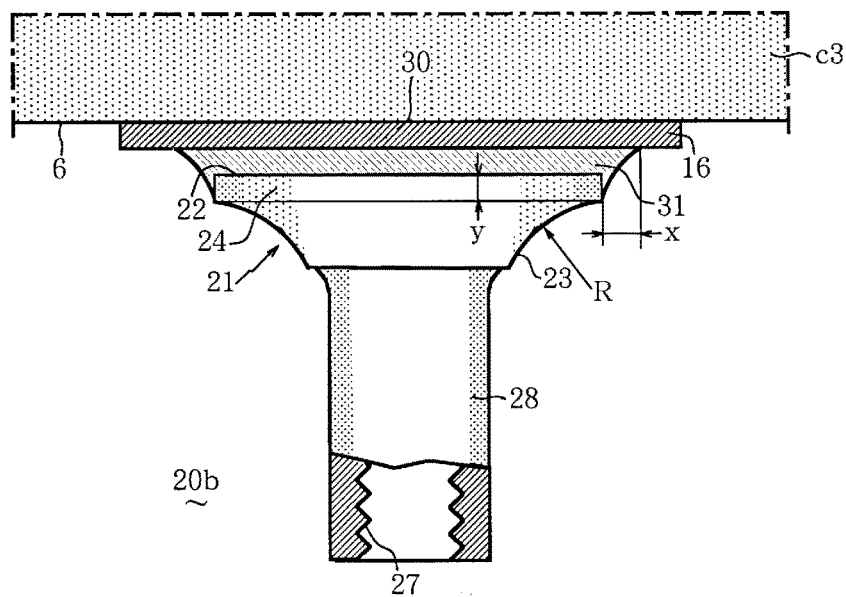
FIG. 4 Enlarged fragmentary view which is similar to the above-described view and which shows a stud according to a different embodiment and its vicinity.

FIG. 4 is an enlarged fragmentary view which is similar to the above-described view and which shows a stud 20b according to a different embodiment.

The stud 20b is a single member formed of Kovar which is similar to that of the above-described embodiment. As shown in FIG. 4, the stud 20b includes a flange portion 21 which is similar to that of the above-described embodiment and a nut tube portion 28 which perpendicularly extends from a central portion of the outside surface 23 of the flange portion 21 and which has a circular columnar shape as a whole. The nut tube portion 28 has an axially extending internal thread 27 which is spirally formed, through cutting, in its hollow portion extending along the center axis. Notably, the outside surface 23 of the flange portion 21 has a single curvature radius R as shown in the drawing. However, the outside surface 23 may have the above-described two curvature radiuses R1 and R2.

According to the wiring substrate 1 of the present invention having been described above, each of the studs 20a and 20b is configured such that, in a vertical cross section along the axial direction of the bolt portion 26 or the nut tube portion 28 perpendicularly provided at a center portion of the outside surface 23 of the flange portion 21, the outside surface 23 is composed of a curved surface convex toward the inside surface 22 of the flange portion 21, and such that the thickness of the flange portion 21 gradually decreases from the center portion toward the peripheral side in plan view. Therefore, when an external force toward the outer side of the back surface 6 of the first laminate 3 acts on the stud 20a or 20b along the axial direction of the bolt portion 26 or the nut tube portion 28, the stress (component force) of the external force acting on a part of the flange portion 21, which part is located on the annular surface 24 side and has a relatively small thickness is mitigated. Accordingly, it is possible to reliably prevent or restrain generation of a crack in the ceramic layer c3 near a region of the back surface 6 of the first laminate 3, which region is located adjacent to the periphery of the flange portion 21. Such an effect (1) can be obtained more remarkably in the above-described embodiment in which the outside surface 23 of the flange portion 21 has the two curvature radiuses R1 and R2.

Also, in each of the studs 20a and 20b, since the thickness of the flange portion 21 at the center is larger than that at the periphery thereof, a decrease in the strength of the flange portion 21 can be prevented.

Further, the peripheral portion 31 of the brazing material layer 30 disposed between the metal layer 16 and the inside surface 22 of the flange portion 21 has a fillet shape formed as a result of expanding, due to wetting, along the axial direction of the annular surface 24. As a result, it is possible to prevent the peripheral portion 31 of the brazing material layer 30 from accidentally protruding into a region of the back surface 6 of the first laminate 3, which region is located outside the metal layer 16. Therefore, it is possible to prevent accidental formation of short circuits between the studs 20a or 20b and the connection terminals 12 or the like formed on the back surface 6 at a fine pitch such that the connection terminals 12 or the like are located adjacent to the respective studs.

In addition, by adjusting, through the plurality of studs 20a or 20b, the posture of the wiring substrate 1 with respect to a surface of a silicon wafer or the like to be inspected, the probe pins 18 which are individually implanted in the upper surfaces of the plurality of pads for probe 15 later on can be individually brought into contact with a plurality of electronic components formed on the surface of the silicon wafer or the like, whereby a desired electrical inspection can be performed accurately.

Accordingly, the wiring substrate 1 can yield the aforementioned effects (1) to (4) without fail.

The present invention is not limited to the above-described embodiments and example.

For example, the number of the ceramic layers constituting the first laminate 3 may be two or four or more, and the ceramic of the ceramic layers may alumina, aluminum nitride, or mullite.

Also, the number of the resin layers constituting the second laminate 4 may be two or four or more, and the resin layers may be formed of epoxy resin.

Further, the studs 20a and 20b may be formed of 42 alloy, 194 alloy, or any one of various types of stainless steels.

Further, the flange portion 21 of each of the studs 20a and 20b may be configured such that the outside surface 23 of the flange portion 21 has three or more curved surfaces which are arranged concentrically in plan view and which have curvature radiuses different from one another.

Also, the outside surface 23 of the flange portion 21 of each of the studs 20a and 20b may be a flat surface on the peripheral edge side, so long as the outside surface 23 has a curved surface, which is defined by the above-described curve, on the center side where the bolt portion 26 or the nut tube portion 28 is located in plan view. In plan view, the range of the curved surface is at least 50% or more of the range of the outside surface of the flange portion 21 in the radial direction, excluding the bolt portion 26 or the nut tube portion 28.

In addition, the stud 20a may have an internal thread hole which extends along the center axis of the bolt portion 26 and which has an internal thread 27 formed on the inner circumferential surface thereof through cutting, and the stud 20b may have an external thread 25 which is formed on the outer circumferential surface of the nut tube portion 28 through cutting.

INDUSTRIAL APPLICABILITY

According to the present invention, there can be provided a wiring substrate for electronic component inspection apparatus in which, even when an axial external force is applied to the bolt portion or the nut tube portion of one of the plurality of studs joined to the back surface of the first laminate formed of ceramic, a crack is less likely to be generated in the ceramic in a region of the back surface of the first laminate, which region is located adjacent to the circumferential edge of the flange portion of the stud.

DESCRIPTION OF SYMBOLS

1: wiring substrate for electronic component inspection apparatus/wiring substrate
3: first laminate
4: second laminate
5, 7: front surface
6: back surface
15: pad for probe
16: metal layer
20a, 20b: stud
21: flange portion
22: inside surface
23: outside surface
24: annular surface
26: bolt portion
28: nut tube portion
30: brazing material layer
c1-c3: ceramic layer
j1-j3: resin layer
R1, R2: curvature radius

What is claimed is:

1. A wiring substrate for electronic component inspection apparatus comprising a first laminate which is formed by stacking a plurality of ceramic layers and which has a front surface and a back surface, and a plurality of studs joined to the back surface of the first laminate, the wiring substrate for electronic component inspection apparatus being characterized in that each of the studs is composed of a flange portion which is circular in bottom view, and a bolt portion or a nut tube portion which perpendicularly extends from a center portion of the flange portion; and in a vertical cross section of the flange portion along an axial direction of the bolt portion or the nut tube portion, an outside surface of the flange portion from which the bolt portion or the nut tube portion protrudes is defined by a curve which is convex toward an inside surface of the flange portion facing the back surface of the first laminate.

2. The wiring substrate for electronic component inspection apparatus according to claim 1, wherein, in the vertical cross section along the axial direction of the bolt portion or the nut tube portion, the outside surface of the flange portion of the stud is defined by a curve having a single curvature radius or a curve having a plurality of curvature radiuses.

3. The wiring substrate for electronic component inspection apparatus according to claim 1, wherein a thickness of the flange portion at its center is greater than that at its periphery.

4. The wiring substrate for electronic component inspection apparatus according to claim 1, wherein each of the studs has an annular surface which has a length of 200 μm or less along the axial direction of the bolt portion or the nut tube portion and which is located between a peripheral edge of the outside surface of the flange portion of the stud and a peripheral edge of the inside surface of the flange portion of the stud.

5. The wiring substrate for electronic component inspection apparatus according to claim 1, wherein each of the studs is joined to the back surface of the first laminate via a brazing material layer which is disposed between the inside surface of the flange portion of the stud and a metal layer formed on the back surface of the first laminate.

6. The wiring substrate for electronic component inspection apparatus according to claim 1, wherein a second laminate formed by stacking a plurality of resin layers is disposed on the front surface of the first laminate, and a plurality of pads for probe is formed on a front surface of the second laminate.

* * * * *